(12) United States Patent
Rauch et al.

(10) Patent No.: US 11,971,162 B2
(45) Date of Patent: Apr. 30, 2024

(54) ILLUMINATED FIBER-BASED VEHICLE TRIM COMPONENTS AND FLOORING

(71) Applicant: Auria Solutions UK I, Ltd., London (GB)

(72) Inventors: Sascha Rauch, Cologne (DE); Philipp Hilbert, Hannover (DE); Gerrit Symkenberg, Isernhagen (DE); Michael Mueller, Winsen (DE)

(73) Assignee: Auria Solutions UK I, Ltd., London (GB)

( * ) Notice: Subject to any disclaimer, the term of this patent is extended or adjusted under 35 U.S.C. 154(b) by 0 days.

(21) Appl. No.: 17/771,964

(22) PCT Filed: Nov. 4, 2020

(86) PCT No.: PCT/US2020/058938
§ 371 (c)(1),
(2) Date: Apr. 26, 2022

(87) PCT Pub. No.: WO2021/092055
PCT Pub. Date: May 14, 2021

(65) Prior Publication Data
US 2022/0404011 A1    Dec. 22, 2022

Related U.S. Application Data

(60) Provisional application No. 62/930,339, filed on Nov. 4, 2019.

(51) Int. Cl.
*F21V 33/00*    (2006.01)
*B32B 3/30*    (2006.01)
(Continued)

(52) U.S. Cl.
CPC ............ *F21V 33/0024* (2013.01); *B32B 3/30* (2013.01); *B32B 5/073* (2021.05); *B32B 5/18* (2013.01); *B32B 5/245* (2013.01); *B32B 27/12* (2013.01); *D06N 7/0039* (2013.01); *D06N 7/0086* (2013.01); *B32B 2307/414* (2013.01); *B32B 2307/718* (2013.01); *B32B 2307/72* (2013.01);
(Continued)

(58) Field of Classification Search
CPC .... F21V 33/0024; B32B 5/073; D06N 7/0039
See application file for complete search history.

(56) References Cited

U.S. PATENT DOCUMENTS

2005/0064779 A1    3/2005    Allison et al.
2007/0065628 A1    3/2007    Allison et al.
(Continued)

OTHER PUBLICATIONS

International Search Report Written Opinion from corresponding PCT Appln. No. PCT/US20/58938, dated Feb. 2, 2021.10 pages.
(Continued)

*Primary Examiner* — Christopher E Dunay
(74) *Attorney, Agent, or Firm* — Grossman, Tucker, Perreault & Pfleger PLLC; Steven J. Grossman

(57) ABSTRACT

A light-emitting carpet or light-emitting trim panel that employs a translucent polymer sheet that has a protective layer and a plurality of cavities configured to accept a plurality of light emitting diodes (LEDs) arranged to generate light where the LEDs are configured to align and project into the polymeric sheet cavities.

19 Claims, 6 Drawing Sheets

(51) Int. Cl.
*B32B 5/06* (2006.01)
*B32B 5/18* (2006.01)
*B32B 5/24* (2006.01)
*B32B 27/12* (2006.01)
*D06N 7/00* (2006.01)
*F21Y 115/10* (2016.01)

(52) U.S. Cl.
CPC ..... *B32B 2307/732* (2013.01); *B32B 2471/02* (2013.01); *B32B 2605/003* (2013.01); *F21Y 2115/10* (2016.08)

(56) References Cited

U.S. PATENT DOCUMENTS

| | | | |
|---|---|---|---|
| 2010/0232171 A1 | 9/2010 | Cannon et al. | |
| 2010/0271805 A1* | 10/2010 | Van Herpen | B60N 3/048 |
| | | | 156/60 |
| 2011/0286213 A1 | 11/2011 | Van Herpen et al. | |
| 2011/0292641 A1* | 12/2011 | Van Herpen | F21V 23/0442 |
| | | | 362/153 |
| 2013/0120975 A1* | 5/2013 | Van Herpen | F21S 8/04 |
| | | | 362/147 |
| 2018/0273178 A1* | 9/2018 | Ibrahim | G09F 13/0418 |
| 2019/0054996 A1* | 2/2019 | Ibrahim | B64D 47/02 |
| 2022/0055515 A1* | 2/2022 | Delmas | B60Q 3/54 |

OTHER PUBLICATIONS

"Fiberglass", Wikipedia, 1993 [retrieved from the internet on Dec. 31, 2020 at ,https://en.wikipedia.org/wiki/Fiberglass.], paragraph 1.
Extended European Search Report from related Application No. 20884077.7, dated Nov. 15, 2023. 8 pages.

* cited by examiner

ILLUMINATED FIBER-BASED VEHICLE TRIM COMPONENTS AND FLOORING

FIELD

The present invention is directed at the addition of lighting features to vehicular trim components and vehicle flooring that utilizes fiber-type construction.

BACKGROUND

Vehicle trim components and vehicle flooring generally define the interior appearance that is seen by the consumer. With the advent of advanced lighting capabilities, there have been efforts to more strategically locate lighting within the interior of the vehicle to provide an improved visual experience. The problems that confront such a goal have included proper placement of such lighting on or within the trim component or flooring and which placement can be achieved by conventional processing without damage to the lighting electronic equipment during manufacture. In addition, problems have remained when incorporating such lighting into locations where the lighting may also be subject to wear, such as in carpet or trunk flooring.

SUMMARY

A light-emitting carpet comprising a first carpet layer that is configured to be exposed and come in contact with a vehicle occupant, a translucent polymer sheet layer providing a protective layer including a protective layer inner surface and protective layer outer surface and a plurality of cavities configured to accept a plurality of light emitting diodes (LEDs) arranged to generate light, a plurality of LEDs configured to align and project into said cavities; and a carpet backing layer.

A light-emitting trim panel comprising a first layer that is configured to be exposed and come in contact with a vehicle occupant; a translucent polymer sheet layer providing a protective layer including a protective layer inner surface and protective layer outer surface and a plurality of cavities configured to accept a plurality of light emitting diodes (LEDs) arranged to generate light; and a plurality of LEDs configured to align and project into said cavities.

DRAWINGS

FIG. 1 provides a cross-sectional view of the integration of a light emitting diode (LED) panel into vehicle flooring.

FIG. 2 provides an expanded view of the LED panel in combination with the translucent polymer sheet, as shown in FIG. 1.

DETAILED DESCRIPTION

Figure 1:
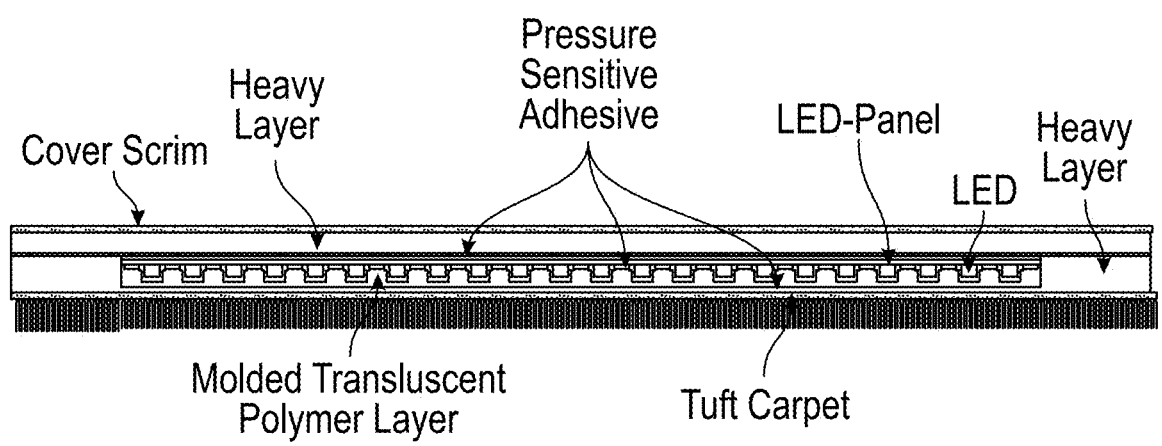

The present disclosure relates to integration of a light emitting diode (LED) panel into trim components or vehicle flooring. With regards to vehicle flooring, the present disclosure relates to integration of the LED panel into a carpet for a vehicle, where the carpet is preferably a tufted carpet and which includes additional layers and can further serve as a heavy "mass" layer in a vehicular "acoustic mass-spring system" to control sound transmission. Reference to a "mass" layer herein may be understood as an acoustic barrier mass to the transmission of sound energy through the material. A representative mass layer herein would include thermoplastic polyolefins containing mineral fillers like calcium carbonate and/or barium sulfate, processing aids, stabilizers and color pigments. and have a thickness of 0.4 mm to 5.0 mm and a density of 1.1 g/cm$^3$ to 2.6 g/cm$^3$. One may also utilize a foam as a layer in the carpet behind the above referenced mass layer where the foam preferably has a density of 30 kg/m$^3$ to 200 kg/m$^3$ or a felt material layer with a basis weight of 300 g/m$^2$ to 3000 g/m$^2$. Felt material is reference to textile material produced by matting, condensing and pressing of the fibers together.

The initial component of the present invention is the LED panel, which can include an array of LED lights. By way of example, an LED panel herein may include multiple rows and columns of LED lights. Such LED panel may include, for example 20-30 LED lights extending in a given column and 20-30 LED lights extending in any given row. The LED lights are configured such that they are preferably arranged on the panel and will then project into cavities present in a translucent polymer sheet layer. See FIG. 2. The invention herein is not limited by the number or arrangement of LED lights in the panel, and is identified only for illustrative purposes. It is noted that preferably, the LED lights protrude from an underlying electronic circuit layer a distance in the range of 0.5 mm to 2.0 mm.

The invention here preferably relies upon a sheet of polymeric material, which is preferably translucent, meaning that it will itself transmit visible light of the LEDs to a vehicle occupant. The sheet is also one that preferably resists moisture transmission from, e.g., wet shoes or spilled drinks. Reference to sheet form is reference to the feature that it is not a woven or non-woven type material and the sheet is preferably formed by a melt processing step where the polymer material emerges from a die (see below). The sheet is preferably selected and formed from a thermoplastic material but may utilize any polymeric resin that can be employed to produce a sheet configuration, including thermoset type resins. Preferred polymer materials that may be utilized include polyolefins, including polyethylene and/or polypropylene. In the case of polyethylene, this may include: (1) low density polyethylene (LDPE) having a density in the range of up to about 0.93 g/cc, or more preferably, in the range of 0.91 g/cc to 0.93 g/cc; (2) linear low density polyethylene (LLDPE) which has primarily a controlled amount of short chain branching and a density in the range of 0.91 g/cc to 0.94 g/cc; (3) high density polyethylene (HDPE) which has a relatively low amount, if any, of branching and a density in the range of 0.94 g/cc to 0.96 g/cc. It is also contemplated that one may utilize other polyethylene in sheet form such as crosslinked polyethylene and ultra-high molecular weight polyethylene (UHMWPE). Another particularly preferred thermoplastic selection included those polyethylene resins formed from metallocene based catalysts, otherwise known as m-PE. In addition, one can include ethylene-vinyl-acetate copolymer resins, known as EVA, where the level of vinyl acetate may fall in the range of 10% to 40%, and more preferably, in the range of 15% to 25%. Other contemplated resins include polycarbonate, polyesters such as PET sheet material, and polycarbonate/ABS blends.

Preferably, the thermoplastic resin, which is described herein as one potential example of polymeric sheeting, is formed by heating and melting granules of the thermoplastic in a heated press. It is also preferable to reduce or eliminate any air void formation during such pressing that would otherwise interfere with the transmission of light. Accordingly, the sheet is one herein that preferably avoids the formation of air voids that have a size of greater than 0.25 mm. In addition, during molding, the thermoplastic sheet is shaped so that it will include a plurality of depressions which then can preferably form slots which as described herein, can accept the LED lights.

Preferably, the depressions provide a remaining protective layer thickness of 1.0 mm to 10.0 mm for the LED lights so that the LED lights then can transmit light through the protective layer thickness (See FIG. 2) to be seen by a vehicle occupant. More preferably, the protective layer thickness ($t_{PL}$) may be 1.0 mm to 5.0 mm or more preferably 1.0 mm to 3.0 mm, or even more preferably, 1.0 mm to 2.0 mm. As may be appreciated, the protective layer thickness may vary depending upon the wear requirements of the final product as well as the mechanical properties of the plastic employed for the plastic layer, such as modulus and hardness values. Preferably, the slots in the selected plastic are configured such that they will align with the columns and rows of the selected LED lighting pattern. Next, the thermoplastic resin sheet described above is attached to a carpet backing layer. This may be accomplished via an adhesive and/or by the use of heat such that the carpet backing is laminated to the thermoplastic resin. Preferably, the carpet backing will contain a latex coating for the binding of the carpet fiber along with an additional polyolefin (e.g. polyethylene) backing which can be relied upon when heated to adhere to the thermoplastic resin sheet. Preferred adhesives include pressure sensitive adhesives and polymeric binding spray glues and the latex coating itself may preferably comprise ethylene-vinyl acetate, styrene-butadiene rubber and/or acrylic latex formulations preferably without fillers to promote light transmission. In addition, a thermobonded carpet may be employed.

Then, the LED panel noted above is preferably attached to the thermoplastic resin sheet where the LED lights are, as noted, configured to align and project into the depressions or cavities of the plastic sheet. Preferably, as discussed herein, an air gap is present within the cavities as between the LED and the polymeric sheeting. However, the non-compressed areas of the polymeric sheeting engage with the ground plate of the LED panel.

The attachment to the LED panel with the LED lights aligned into the depressions or cavities of the polymeric sheet can preferably be achieved by placement of double-sided adhesive tape strips positioned between the rows/columns between the LED lights. In this manner, while the thickness of the polymeric sheet and the protrusion of the LED lights are selected such that only the LED lights align in the identified slots or cavities, above an air gap, the electronic circuitry in the LED light array also remains protected by the plastic sheet when employed in the final carpet product.

In addition, on the backside of the LED panel, one may also preferably position double sided adhesive tape such that the backside of the LED panel may be attached and adhered to the selected mass layer, which as alluded to above, is a layer of material that is designed to serve as an acoustic barrier mass to the transmission of sound energy. The mass layer may again preferably comprise thermoplastic polyolefins including mineral fillers such as calcium carbonate and/or barium sulfate and have a thickness of 0.4 mm to 5.0 mm and a density of 1.1 g/cm$^3$ to 2.6 g/cm$^3$.

FIG. 1 provides a cross-sectional view of the integration of a light emitting diode (LED) panel into vehicle flooring. As illustrated, a molded translucent polymer layer is preferably utilized in a tufted carpet construction. The translucent polymer layer is understood herein as a layer that allows for transmission of light by the LEDs to the vehicle occupant. The molded translucent polymer layer provides a protective layer for the individual LED lights of the LED panel. As illustrated, the vehicle flooring preferably includes the tufted carpeting layer (which is seen by the vehicle occupant) followed by a pressure sensitive adhesive layer or polymeric binding spray glue. However, in the broad context of the present invention, the flooring may begin with any exposed carpet surface that is suitable for use in vehicle flooring, and is such that it is exposed to the occupant and comes in contact with the user, typical the feet or shoes of such occupant. While a tufted carpet is therefore preferred for a vehicle application, it is contemplated herein that the light-emitting carpet would apply equally as well for a woven or non-woven carpet construction as well as dilour carpet or standard needle felts.

In addition, one may rely upon polymeric binding spray glues or a heat lamination of a polyethylene back carpet to the translucent polymer layer. As also shown in FIG. 1, one may then preferably apply a cover-scrim which preferably may be formed from polyester. Polyester scrim may then promote adhesion to foam if the subject part is back-foamed with, e.g., a polyurethane foam material to form an acoustic-mass-spring system.

Figure 2:
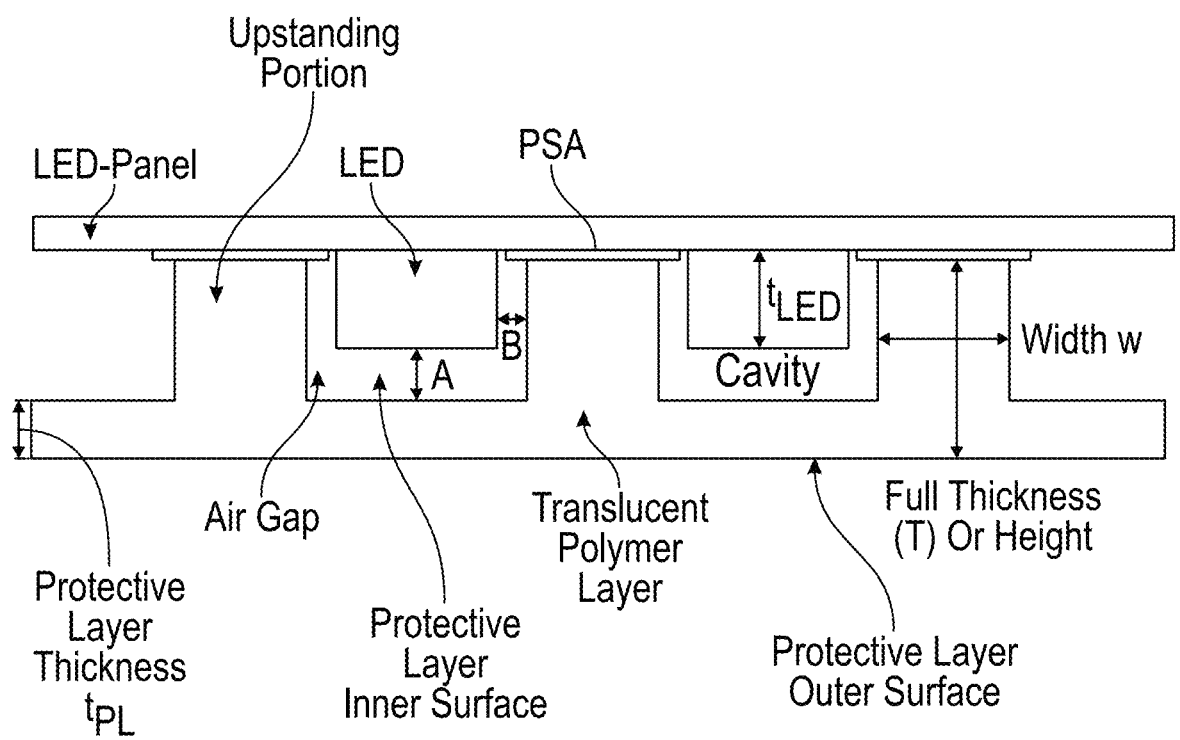

With attention directed to FIG. 2, which is an expanded view of a portion of FIG. 1, the molded translucent polymer layer follows where the pressure sensitive adhesive is preferably applied at the location between the depressions that provide the identified protective layer. As can be seen, the LED light extends from the LED panel into the depressions/cavities or slots and an air gap is preferably present. The plurality of cavities or depressions in the translucent polymer sheet layer are formed by upstanding structural portions form the polymeric sheet. The distance "A" between the surface of the LED and the bottom of the depression or cavity, or what can be described as the distance from the LED to the protective layer inner surface, is preferably in the range of 0.25 mm to 3.00 mm, more preferably 1.00 mm to 3.00 mm, or even more preferably, greater than 1.1 mm to 3.00 mm. The distance "B" between the LED and a sidewall of the depression is preferably in the range of 0.2 mm to 2.0 mm. More preferably, the distance "A" has a value of 0.50 mm to 1.50 mm and the distance "B" has a value of 0.4 mm to 0.8 mm. As noted above, the protective layer thickness can be 1.0 to 10.0 mm. Also identified is the thickness of the LED ($t_{LED}$) and the thickness of the protective layer ($t_{PL}$).

In addition, as illustrated in FIG. 2, the polymer sheet is such that it has upstanding portions that have a full thickness or height that falls in the range of 2.0 mm to 15.0 mm. For example, in that situation where the protective layer thickness is on the relative low side and is about 1.0 mm to 1.5 mm, the full thickness or height of the upstanding portions would preferably fall in the range of 3.5 mm to 4.0 mm. In addition, the width of the upstanding portions preferably falls in the range of 1.0 mm to 20.0 mm, more preferably 1.0 mm to 10.0 mm, and even more preferably 1.0 mm to 5.0 mm.

Figure 3B:
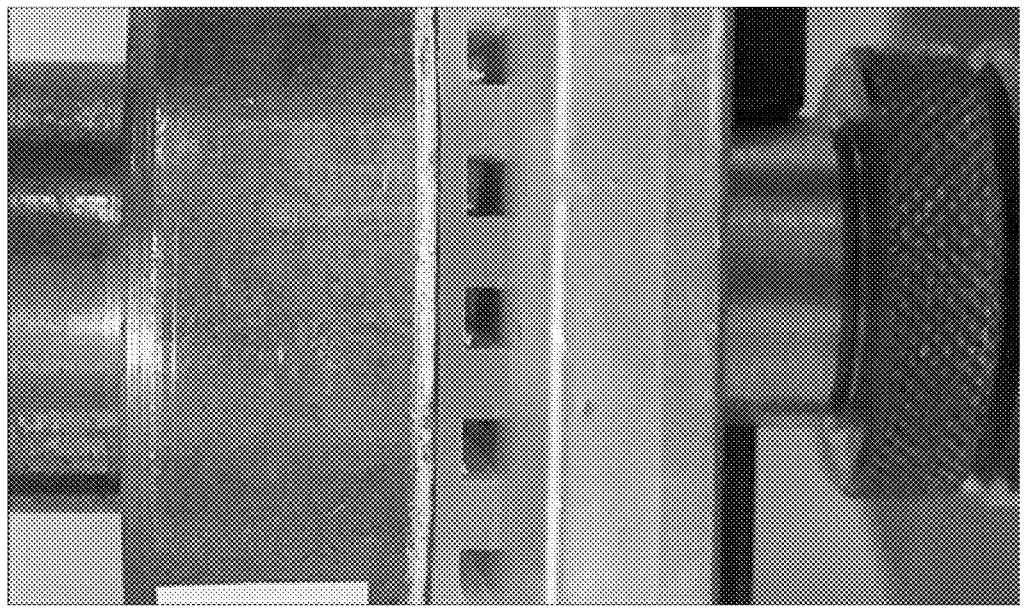
FIG. 3B is a photograph of testing apparatus upon the application of a compression force.
Figure 3A:
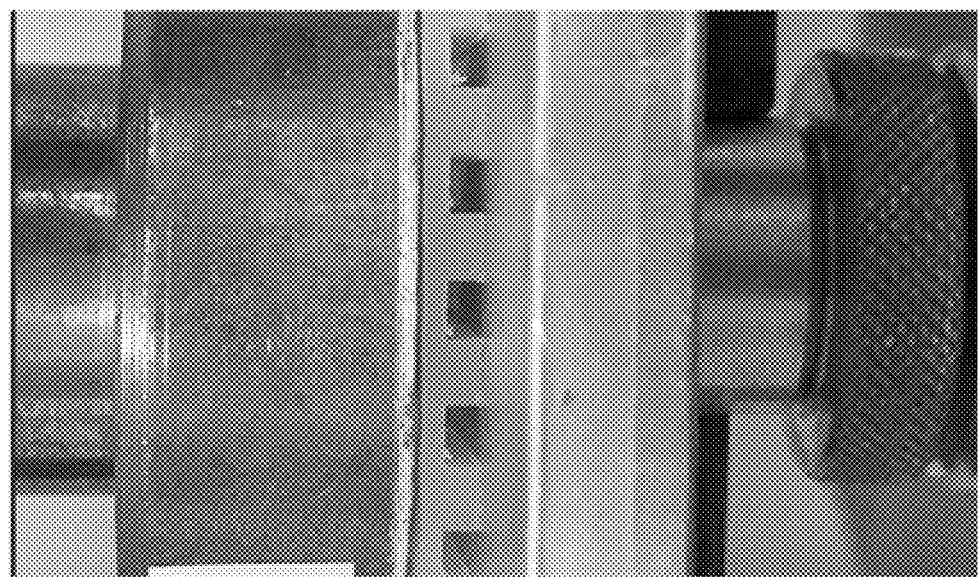
FIG. 3A is a photograph of the testing apparatus employed herein.

Testing was carried-out to evaluate the mechanical strength of the polymeric sheet to prevent damage to the LEDs of an LED panel. For such testing a polymeric sheet material herein, comprised of ethylene-vinyl acetate (18%) having a plurality of cavities or slots for a plurality of LEDs, with a protective layer thickness of about 1.1 mm to 1.3 mm, and a full thickness or height of 3.7-3.8 mm, was exposed to a compression force, via use of a diameter stamp having a 50 mm diameter (D), at a force of 1000 N, 2000 N, 3000 N and 6000 N. See FIG. 3A which is a photograph of the testing apparatus showing the ring resting on the polymeric sheet, and FIG. 3B which is at the end of the application of the compression forces (and as can be seen, the polymeric sheet has undergo almost full recovery). The results are provided below in Table 1 identifying the depth of impression that was observed in the polymeric sheet material.

TABLE I

| Name | D (mm) | Full Sample Thickness or Height | Depth of Impression (mm) | Force (N) |
|---|---|---|---|---|
| Test 12 | 50.0 | 3.7 | 0.4 | 1003 |
| Test 13 | 50.0 | 3.7 | 0.5 | 2008 |
| Test 14 | 50.0 | 3.7 | 0.5 | 2005 |
| Test 15 | 50.0 | 3.7 | 0.6 | 3009 |
| Test 16 | 50.0 | 3.7 | 0.6 | 3001 |
| Test 17 | 50.0 | 3.7 | 0.9 | 6002 |
| Test 18 | 50.0 | 3.8 | 1.0 | 6008 |

As can be observed from the above, using a 50 mm diameter stamp, the polymer sheet material indicated a depth of impression of only 0.4 mm to 1.0 mm over a force range of about 1000 N to 6000 N. In other words, the indentation of the 50 mm diameter stamp, into the polymer sheet, was only about 0.4 mm to 1.0 mm, thereby confirming that the polymeric sheet provides very good protection to the LEDs that would otherwise be present therein. In addition, it can be appreciated that the above forces are considered to exceed those that would otherwise be experienced by a carpet lay-up containing the polymeric sheet material and LEDs, such as the weight of a typically person's foot or leg that may be resting on the carpet, or ever if an individual might place all or a portion of their weight onto the carpet surface.

Figure 4:
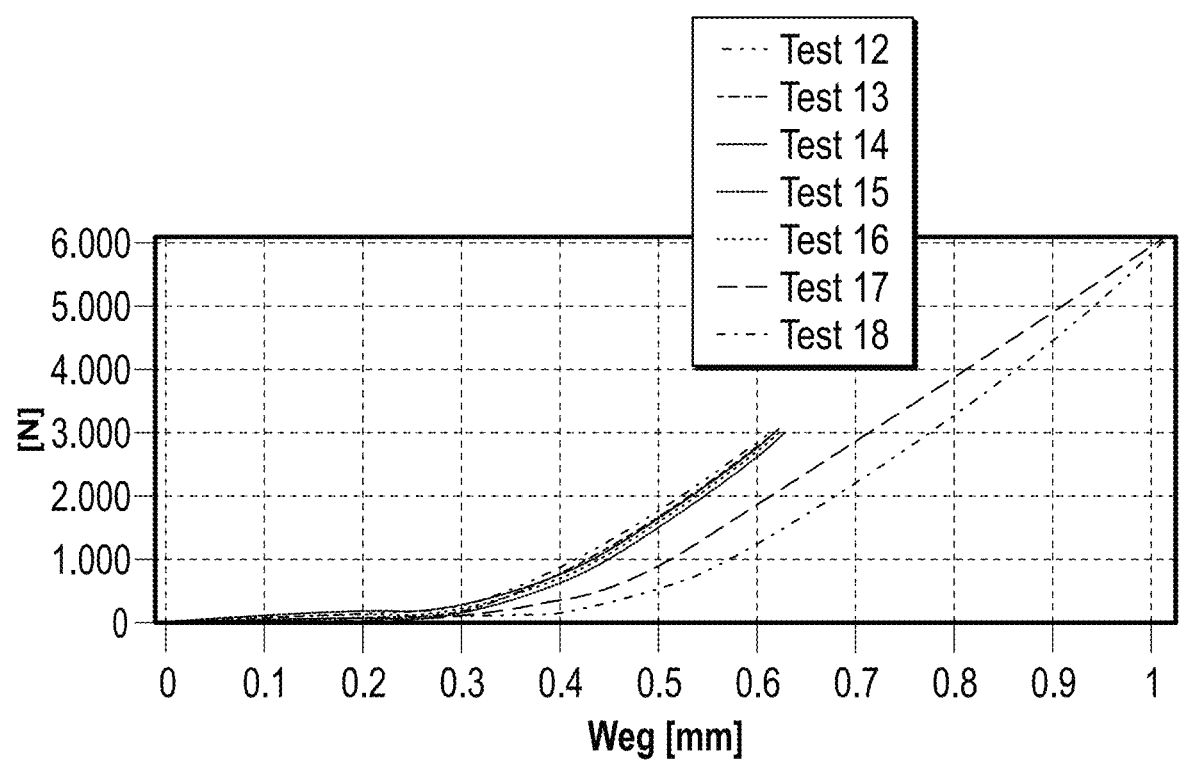
FIG. 4 is a graphical representation of the data in Table 1, along with recovery curves.

As alluded to above, attention is next directed to FIG. 4 which is graphical presentation of what is identified in Table 1, showing the applied force in Newtons [Kraft [N]] and the depth of depression, along with the recovery curves. As can be seen, the polymeric sheet material herein is one that not only can support and prevent damage to the LEDs under the indicated load, the polymeric sheet is one that generally recovers to its original dimensions and the depth of depression (Weg[mm]) caused by the applied force recovers to a level of 95% or greater. A recovery of 100% would mean that there is no evidence of any depression in the polymeric sheet material.

Reference is next made to Table 2 below. Once again, a polymeric sheet material (EVA 18%) was subject to compression with a 50 mm diameter (D) stamp. The polymeric sheet material again had a plurality of cavities or slots for a plurality of LEDs, with a protective layer thickness of about 1.8 mm to 1.9 mm, and a full thickness or height of 3.9-4.0 mm and the results were as follows:

TABLE 2

| Name | D (mm) | Full Sample Thickness or Height | Depth of Impression (mm) | Force (N) |
|---|---|---|---|---|
| Test 19 | 50.0 | 4.0 | 0.5 | 1002 |
| Test 20 | 50.0 | 3.9 | 0.4 | 1002 |
| Test 21 | 50.0 | 3.9 | 0.4 | 1011 |
| Test 22 | 50.0 | 3.9 | 0.5 | 2005 |
| Test 23 | 50.0 | 3.9 | 0.5 | 2012 |
| Test 24 | 50.0 | 3.9 | 0.5 | 2004 |
| Test 25 | 50.0 | 3.9 | 0.6 | 3018 |
| Test 26 | 50.0 | 3.9 | 0.6 | 3006 |
| Test 27 | 50.0 | 3.9 | 0.6 | 3013 |
| Test 28 | 50.0 | 3.9 | 0.7 | 4016 |
| Test 29 | 50.0 | 3.9 | 0.7 | 4019 |
| Test 30 | 50.0 | 3.9 | 0.7 | 4013 |
| Test 31 | 50.0 | 3.9 | 0.8 | 5006 |
| Test 32 | 50.0 | 3.9 | 0.8 | 5006 |
| Test 33 | 50.0 | 3.9 | 0.8 | 5011 |
| Test 34 | 50.0 | 3.9 | 0.9 | 6015 |
| Test 35 | 50.0 | 3.9 | 0.9 | 6011 |
| Test 36 | 50.0 | 3.9 | 0.8 | 6002 |

Similar to the results in Table 2, the polymeric sheet material again showed its ability to protect the LEDs from a compression/indentation type force. For the 50 mm diameter stamp, the polymer sheet material having a plurality of cavities/slots for the LEDs, indicated a depth of depression in the range of 0.4 mm to 0.9 mm, over the force range of about 1000 N to 6000 N.

Figure 5:
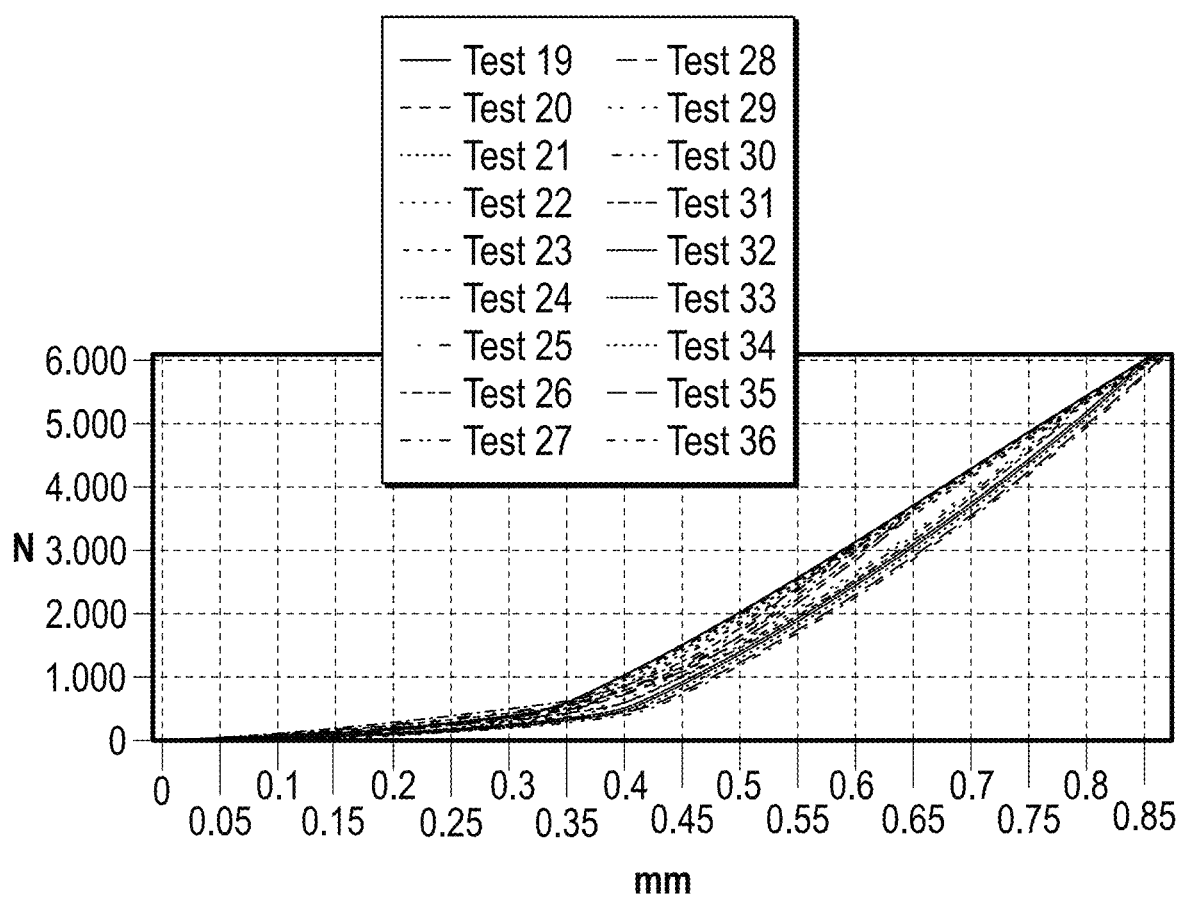
FIG. 5 is a graphical representation of the data in Table 2, along with recovery curves.
Figure 6:
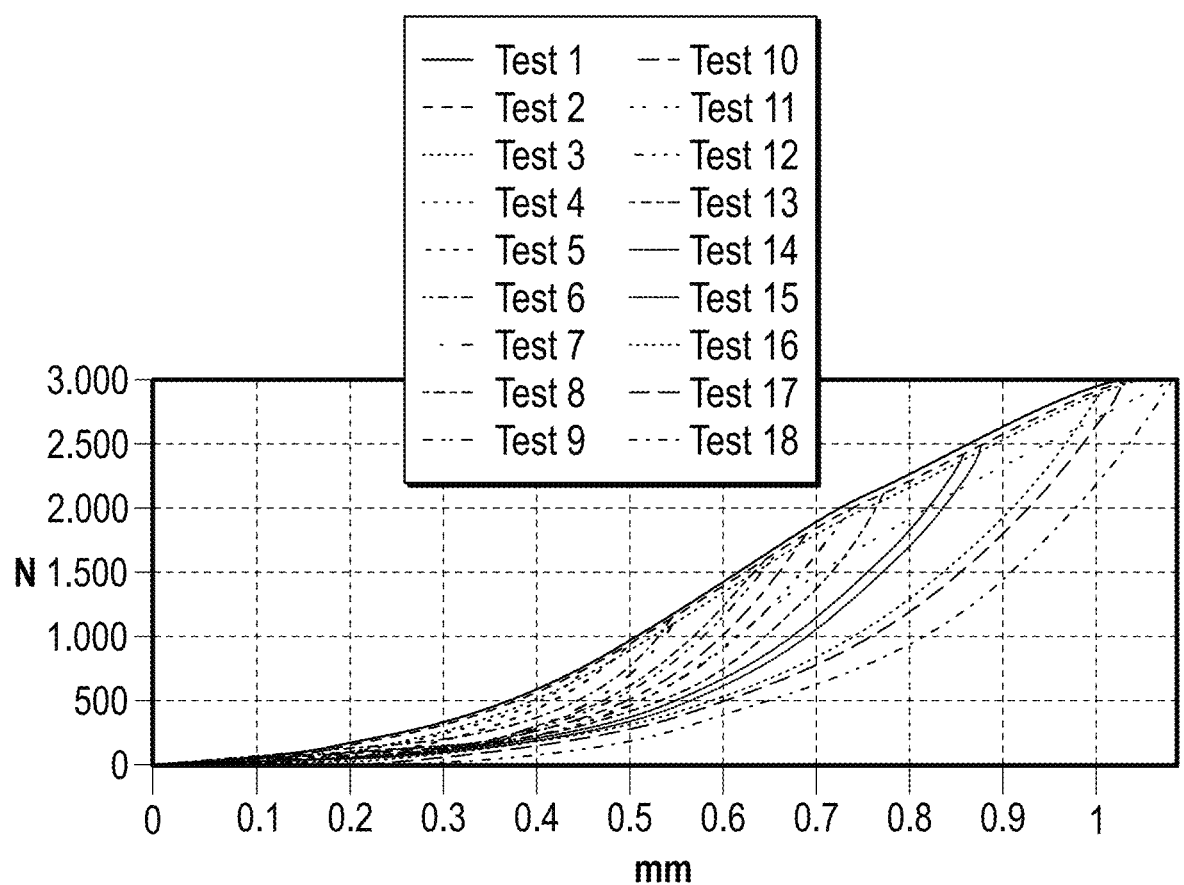
FIG. 6 is a graphical representation of the data in Table 3, along with recovery curves.

Attention is next directed to FIG. 5 which is graphical presentation of what is identified in Table 2, showing the applied force in Newtons [N]] and the depth of depression, along with the recovery curves. As can be seen, the polymeric sheet material herein is again one that not only can support and prevent damage to the LEDs under the indicated load, the polymeric sheet is one that generally recovers to its original dimensions and the depth of depression (Weg[mm]) caused by the applied force recovers to a level of 95% or greater.

Reference is next made to Table 3 below. Once again, a polymeric sheet material (EVA 18%) was subject to compression, but this time with a 25 mm diameter (D) stamp. The polymeric sheet material again had a plurality of cavities or slots for a plurality of LEDs, with a protective layer thickness of about 1.4 mm to 1.5 mm, and a full thickness or height of 3.5-3.6 mm and the results were as follows:

TABLE 3

| Name | D (mm) | Full Sample Thickness or Height | Depth of Impression (mm) | Force (N) |
|---|---|---|---|---|
| Test 1 | 25.0 | 3.6 | 0.4 | 501 |
| Test 2 | 25.0 | 3.6 | 0.4 | 503 |
| Test 3 | 25.0 | 3.6 | 0.4 | 504 |
| Test 4 | 25.0 | 3.6 | 0.5 | 1006 |
| Test 5 | 25.0 | 3.6 | 0.5 | 1005 |
| Test 6 | 25.0 | 3.6 | 0.5 | 1002 |
| Test 7 | 25.o | 3.6 | 0.7 | 1503 |
| Test 8 | 25.0 | 3.6 | 0.6 | 1507 |

TABLE 3-continued

| Name | D (mm) | Full Sample Thickness or Height | Depth of Impression (mm) | Force (N) |
|---|---|---|---|---|
| Test 9 | 25.0 | 3.6 | 0.6 | 1508 |
| Test 10 | 25.0 | 3.6 | 0.8 | 2001 |
| Test 11 | 25.0 | 3.5 | 0.7 | 2006 |
| Test 12 | 25.0 | 3.5 | 0.7 | 2005 |
| Test 13 | 25.0 | 3.5 | 0.9 | 2505 |
| Test 14 | 25.0 | 3.5 | 0.9 | 2503 |
| Test 15 | 25.0 | 3.5 | 0.9 | 2503 |
| Test 16 | 25.0 | 3.5 | 1.0 | 3002 |
| Test 17 | 25.0 | 3.5 | 1.0 | 3005 |
| Test 18 | 25.0 | 3.6 | 1.1 | 3002 |

Once again, the polymeric sheet material again showed its ability to protect the LEDs from a compression/indentation type force. For the 25.0 mm diameter stamp, the polymer sheet material having a plurality of cavities/slots for the LEDs, indicated a depth of depression in the range of 0.4 mm to 1.1 mm, over the force range of about 500 N to 3000 N.

Attention is next directed to FIG. 5 which is graphical presentation of what is identified in Table 3, showing the applied force in Newtons [Kraft [N]] and the depth of depression, along with the recovery curves. As can be seen, the polymeric sheet material herein is again one that not only can support and prevent damage to the LEDs under the indicated load, the polymeric sheet is one that generally recovers to its original dimensions and the depth of depression (Weg[mm]) caused by the applied force recovers to a level of 95% or greater.

Investigations were then conducted to ascertain design rules for the value "A" shown in FIG. 2 as well as the value for the full thickness or height. To model the imposition of a load, and develop a design rule for selection of the thickness or height of the upstanding portions of the translucent polymer sheet, seven (7) isolated bars were utilized that correspond to the upstanding portion of the translucent polymer layer shown in FIG. 2. Varying loads, from 500 N to 3000 N were then imposed utilizing a stamp with a diameter of 80 mm. Reference is made to Table 4 below:

TABLE 4

| Test No. | 37-39 | 40-42 | 43-45 | 46-48 | 49-51 | 52-54 |
|---|---|---|---|---|---|---|
| (F) Load [N] | 505 | 1006 | 1510 | 2008 | 2513 | 3010 |
| Stamp Diameter [mm] | 80.0 | 80.0 | 80.0 | 80.0 | 80.0 | 80.0 |
| (N) Number of Bars | 7 | 7 | 7 | 7 | 7 | 7 |
| (t) Bar Height [mm] | 3.76 | 3.74 | 3.74 | 3.74 | 3.73 | 3.72 |
| (L) Bar length [mm] | 50.0 | 50.0 | 50.0 | 50.0 | 50.0 | 50.0 |
| (W) Bar Width [mm] | 3.85 | 3.85 | 3.85 | 3.85 | 3.85 | 3.85 |
| (p) Pressure [Pa] | 3.7E+05 | 7.5E+05 | 1.1E+06 | 1.5E+06 | 1.9E+06 | 2.2E+06 |
| Displacement ($\Delta T$) [mm] | 0.30 | 0.36 | 0.42 | 0.47 | 0.52 | 0.57 |
| Apparent Young's Modulus [Pa] $E_a$ | 4.7E+06 | 7.8E+06 | 1.0E+07 | 1.2E+07 | 1.3E+07 | 1.5E+07 |

From the above, it can be determined that the pressure that may then be applied to the bars (p) is provided by the following equation where F is the load, L is the bar length, and W is the bar width:

$$p = \frac{F}{N*L*W}$$

In the above equation, the values of L and W are in meters. However, since the data in Table 4 is in mm, the equation becomes:

$$p = \frac{F}{N*L/1000*W/1000}$$

The apparent Young's Modulus is calculated using the equation $$E_a = p*T/\Delta T$$

The following design rule for the height or thickness (T) of the upstanding portions therefore preferably follows the following design guide, where q is a safety factor of 1.2 or greater, or preferably in the range of 1.2 to 2.0, $t_{LED}$ is the thickness of the LED and $t_{pL}$ is the thickness of the protective layer, as shown in FIG. 2 (i.e. the thickness of the LEDs as it extends from the LED panel and into the cavity), p is the pressure to be applied, and Ea is the apparent Young's modulus for the selected translucent polymer sheet material with the upstanding portions that form the plurality of cavities for the LEDs:

$$T > q * \frac{t_{LED} + t_{PL}}{1 - p/E_a}$$

$$A = T - (t_{LED} + t_{PL})$$

It may now be appreciated that the present invention also applies to a light-emitting trim panel comprising a first layer that is configured to be exposed and come in contact with a vehicle occupant along with the herein described translucent polymer sheet layer behind the first layer therefore providing a protective layer including a protective layer inner surface and protective layer outer surface and a plurality of cavities configured to accept a plurality of light emitting diodes (LEDs). The LEDs are arranged to generate light and are configured to align and project into the translucent polymer sheet cavities. The LEDs are therefore again protected from any compression force that may be exerted on trim panel first layer. The trim panel first layer may, e.g., comprise dilour material and needle felts.

As may be appreciated, the above construction allows one to embed an LED lighting array into a multi-layer material that may be used, as noted, as a carpet material a vehicle. Accordingly, one may now provide backlighting effects at any location in the carpeting within a vehicle, such as in the passenger compartment and/or the trunk compartment. However, in the broad context of the present disclosure, the feature of providing a polymeric material type panel with a plurality of cavities, which allows for LED lights to align and partially insert, while protecting the LED and the LED lighting electronic circuitry from mechanical wear, can be utilized for the manufacture of other vehicular trim components. Such trim components may include vehicular side panels, floor mats and headliners.

What is claimed is:

1. A light-emitting carpet comprising:
a first carpet layer that is configured to be exposed and come in contact with a vehicle occupant;
a translucent polymer sheet layer providing a protective layer including a protective layer inner surface and protective layer outer surface and a plurality of cavities configured to accept a plurality of light emitting diodes (LEDs) arranged to generate light;
a plurality of LEDs configured to align and project into said cavities; and
a carpet backing layer;
wherein said cavities are formed from a plurality of upstanding portions and said LEDs have a thickness ($t_{LED}$), the translucent polymer sheet has a protective layer thickness $t_{PL}$ and the height T of the upstanding portions is provided by the following relationship:

$$T > q * \frac{t_{LED} + t_{PL}}{1 - p/E_a}$$

where p is the pressure that will be applied to the translucent polymer sheet, q is a safety factor of 1.2 or greater, and $E_a$ is the apparent Young's Modulus for the translucent polymer sheet material.

2. The light-emitting carpet of claim 1 wherein said translucent polymer sheet layer provides a protective layer thickness of 1.0 mm to 10.0 mm including a plurality of upstanding portions that have a height of 2.0 mm to 15.0 mm.

3. The light-emitting carpet of claim 1 wherein said LEDs comprise a LED panel where the LEDs are arranged on said panel to align and project into said cavities in said translucent polymer sheet.

4. The light-emitting carpet of claim 1 wherein said translucent polymer sheet layer comprises a thermoplastic material.

5. The light-emitting carpet of claim 4 wherein said thermoplastic material comprises at least one of polyethylene, polypropylene, ethylene-vinyl acetate copolymer, polycarbonate, polyester, polycarbonate, or polycarbonate/ABS blends.

6. The light-emitting carpet of claim 1 wherein said LEDs, when inserted into said cavities of said polymeric sheet are positioned 0.25 mm to 3.00 mm from said protective layer inner surface.

7. The light-emitting carpet of claim 1 wherein said first carpet layer comprises a tufted carpet layer.

8. The light-emitting carpet of claim 1 wherein said carpet backing layer comprises an acoustic barrier mass to transmission of sound energy.

9. The light-emitting carpet of claim 8 wherein said acoustic barrier mass layer has a thickness of 0.4 mm to 5.0 mm and a density of 1.1 g/cm³ to 2.6 g/cm³.

10. The light-emitting carpet of claim 8 wherein said acoustic barrier mass layer includes a foam layer with a density of 30 kg/m³ to 200 kg/m³.

11. The light-emitting carpet of claim 8 wherein said acoustic barrier mass layer includes a felt material layer with a basis weight of 300 g/m² to 3000 g/m².

12. The light-emitting carpet of claim 1, wherein said safety factor q is in the range of 1.2 to 2.0.

13. A light-emitting trim panel comprising:
a first layer that is configured to be exposed and come in contact with a vehicle occupant;
a translucent polymer sheet layer providing a protective layer including a protective layer inner surface and protective layer outer surface and a plurality of cavities configured to accept a plurality of light emitting diodes (LEDs) arranged to generate light;
a plurality of LEDs configured to align and project into said cavities;
wherein said cavities are formed from a plurality of upstanding portions and said LEDs have a thickness ($t_{LED}$), the translucent polymer sheet has a protective layer thickness $t_{PL}$ and the height T of the upstanding portions is provided by the following relationship:

$$T > q * \frac{t_{LED} + t_{PL}}{1 - p/E_a}$$

where p is the pressure that will be applied to the translucent polymer sheet, q is a safety factor of 1.2 or greater, and $E_a$ is the apparent Young's Modulus for the translucent polymer sheet material.

14. The light-emitting trim panel of claim 13 wherein said translucent polymer sheet layer provides a protective layer thickness of 1.0 mm to 10.0 mm including a plurality of upstanding portions that have a height of 2.0 mm to 15.0 mm.

15. The light-emitting trim panel of claim 13 wherein said LEDs comprise a LED panel where the LEDs are arranged on said panel to align and project into said cavities in said translucent polymer sheet.

16. The light-emitting trim panel of claim 13 wherein said translucent polymer sheet layer comprises a thermoplastic material.

17. The light-emitting trim panel of claim 16 wherein said thermoplastic material comprises at least one of polyethylene, polypropylene, ethylene-vinyl acetate copolymer, polycarbonate, polyester, polycarbonate, or polycarbonate/ABS blends.

18. The light-emitting trim panel of claim 13 wherein said LEDs, when inserted into said cavities of said polymeric sheet are positioned 0.25 mm to 3.00 mm from said protective layer inner surface.

19. The light-emitting trim panel of claim 13, wherein said safety factor q is in the range of 1.2 to 2.0.

* * * * *